United States Patent [19]

Beavis et al.

[11] Patent Number: 4,971,633
[45] Date of Patent: Nov. 20, 1990

[54] PHOTOVOLTAIC CELL ASSEMBLY

[75] Inventors: Leonard C. Beavis, Albuquerque; Janda K. G. Panitz, Edgewood; Donald J. Sharp, Albuquerque, all of N. Mex.

[73] Assignee: The United States of America as represented by the Department of Energy, Washington, D.C.

[21] Appl. No.: 412,711

[22] Filed: Sep. 26, 1989

[51] Int. Cl.$^5$ .................................. H01L 31/052
[52] U.S. Cl. .................................. 136/246; 136/244; 136/256; 437/2; 357/80; 357/81; 204/38.3; 204/38.7
[58] Field of Search .................. 136/244, 246, 256; 437/2-5, 205, 215; 204/38.3, 38.7; 357/80-81

[56] References Cited

U.S. PATENT DOCUMENTS

| | | | |
|---|---|---|---|
| 3,622,473 | 11/1971 | Ohta | 204/38.3 |
| 3,999,283 | 12/1976 | Dean et al. | 437/2 |
| 4,110,122 | 8/1978 | Kaplow et al. | 136/249 |
| 4,510,195 | 4/1985 | Iida et al. | 428/215 |
| 4,781,766 | 11/1988 | Barnett et al. | 136/258 |
| 4,806,436 | 2/1989 | Tada et al. | 428/629 |

FOREIGN PATENT DOCUMENTS

| | | | |
|---|---|---|---|
| 60-198782 | 10/1985 | Japan | 136/256 |
| 61-284971 | 12/1986 | Japan | 136/256 |
| 62-117376 | 5/1987 | Japan | 136/256 |
| 63-222468 | 9/1988 | Japan | 136/256 |
| 63-249379 | 10/1988 | Japan | 136/256 |

Primary Examiner—Aaron Weisstuch
Attorney, Agent, or Firm—Armand McMillan; James H. Chafin; William R. Moser

[57] ABSTRACT

A photovoltaic assembly for converting high intensity solar radiation into electrical energy in which a solar cell is separated from a heat sink by a thin layer of a composite material which has excellent dielectric properties and good thermal conductivity. This composite material is a thin film of porous $Al_2O_3$ in which the pores have been substantially filled with an electrophoretically-deposited layer of a styrene-acrylate resin. This composite provides electrical breakdown strengths greater than that of a layer consisting essentially of $Al_2O_3$ and has a higher thermal conductivity than a layer of styrene-acrylate alone.

16 Claims, 1 Drawing Sheet

PHOTOVOLTAIC CELL ASSEMBLY

This United States Government has rights in this invention pursuant to Contract No. DE-AC04-76DP00789, between the United States Department of Energy and AT&T Technologies, Inc.

The present invention relates to photovoltaic devices, and more particularly to solar photovoltaic devices for converting high intensity solar radiation to electrical energy.

BACKGROUND OF THE INVENTION

Solar photovoltaic cells are semiconductor devices which produce a voltage across output terminals when exposed to sunlight, and typically a plurality of solar cells are interconnected in series to produce a desired voltage. In order to increase the electrical output, attention has been directed to the use of solar cells which operate under conditions of high intensity solar radiation, such as, for example, under conditions of solar fluxes up to hundreds of suns. Solar radiation at high intensities, such as 10–50 watts/cm$^2$, can be achieved by the use of various light concentrating devices such as, for example, concentrating reflectors or lenses such as Fresnel lenses. As the solar radiation incident on a solar cell becomes more intense, the electrical output of the cell is increased; however, for efficient operation, the cell must remain cool in the presence of high radiation levels and therefore a good thermal link between the cell and the external environment is required. The thermal path must also be electrically insulating, and a breakdown voltage of at least about 2,000 volts is desired for some applications. Prior attempts to provide a barrier between solar cells and a heat sink in which the barrier has excellent dielectric strength and also provides adequate heat transmission, have only been partially successful. For example, thin Al$_2$O$_3$ films which are anodically formed on an aluminum substrate exhibit excellent thermal conductivity, i.e., about 10 watts/meter-°Kelvin; however, a portion of the surface is represented by micron-sized pores which severely limit dielectric breakdown strength to less than 1,000 volts. Electrophoretically-deposited styrene-acrylate films have also been tested as barriers. These films, in a thickness of about 40 microns, have dielectric strengths over 2,500 volts, but their thermal conductivity of 0.1 to 0.2 watts/meter-°Kelvin is only marginally useful.

SUMMARY OF THE INVENTION

It is accordingly one object of the present invention to provide a photovoltaic assembly for efficiently converting high intensity solar radiation into electrical energy.

It is another object of the present invention to provide a photovoltaic assembly which includes a barrier layer between a photovoltaic cell and an associated heat sink that combines high electrical insulation and high heat transfer capabilities.

In accordance with the present invention, there is provided a photovoltaic assembly for converting high intensity solar radiation into electrical energy. The photovoltaic assembly includes a base comprising a thermally-conductive backing plate, a composite, thermally-conductive dielectric layer integral with a surface of the backing plate, and a plurality of photovoltaic cells in thermal contact with the Composite layer. The composite thermally-conductive layer comprises a thin film of porous Al$_2$O$_3$ and an electrophoretically deposited styrene-acrylate resin within the pores of the thin film. Coating by electrophoresis selectively plugs electrical defects in the highly thermal conductive film of porous Al$_2$O$_3$ without drastically changing the thermal conductivity of the film, such as would occur if the entire surface of the Al$_2$O$_3$ were coated with a dielectric film of low thermal conductivity. The resulting dielectric layer displays a dielectric breakdown strength much greater than that of an Al$_2$O$_3$ layer of equivalent thickness at least about 2000 volts, and a thermal conductivity which is significantly greater than that of a styrene-acrylate layer having a thickness necessary to provide adequate dielectric strength at least about 0.5 watts/meter °Kelvin.

DETAILED DESCRIPTION OF THE INVENTION

Figure 1:
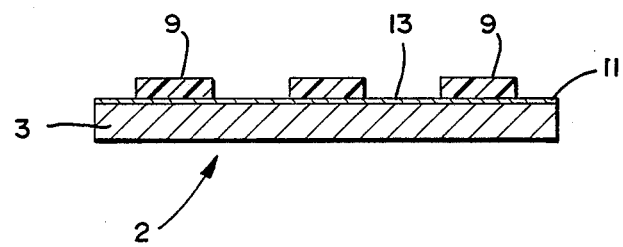
FIG. 1 is a view in cross-section of the photovoltaic assembly of the present invention.
Figure 2:
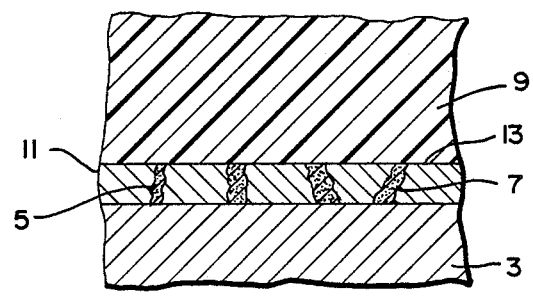
FIG. 2 is an enlargement of a section of FIG. 1.

As shown in the Figures, photovoltaic cell assembly 2 comprises a base 3 and a plurality of photovoltaic cells 9 which are separated from base 3 by thin film 11 of porous Al$_2$O$_3$. Pores 5 which extend to surface 13 of thin film 11, are filled with a styrene-acrylate resin 7.

Auxiliary apparatus to form a complete system for converting solar energy to electrical energy does not form a part of the present invention and suitable apparatus is known and can readily be used with the present invention by workers in the art. For instance, apparatus for concentrating solar radiation onto the cells and apparatus for transferring heat from the backing plate are well-known to workers in the art. For example, the solar radiation may be concentrated by reflectors or lenses such as Fresnel lenses, and heat may be removed by well-known techniques such as by passing a cooling fluid over a surface of the backing plate.

The solar cell may be any photovoltaic cell which is used in converting solar energy to electrical energy, and the specific type of solar cell is not critical to the practice of this invention. U.S. Pat. No. 3,999,283 and U.S. Pat. No. 4,110,122 describe solar cell devices which are particularly well-suited for use with high intensity solar radiation.

In carrying out the present invention, a thin layer of porous Al$_2$O$_3$ is formed on a thermally-conducting support structure which preferably is a highly conductive metal such as, for example, copper or aluminum or their alloys. In the preferred method of carrying out the invention, the thin film of porous Al$_2$O$_3$ is anodically formed on an aluminum or aluminum alloy substrate. The Al$_2$O$_3$ may be deposited on other metals, such as copper or copper alloys, by other techniques such as by using a plasma spray; however, it is expected that the film which is formed will include micropores which will become filled with electrophoretic resin. These pores or defect sites in an anodically-formed Al$_2$O$_3$ film typically occupy about 5% or less of the surface area, and represent electrical leakage points. The present method of making a photovoltaic assembly takes advantage of the fact that electrophoresis deposits are formed only on areas which can deliver a current.

The film of porous Al$_2$O$_3$ may suitably have a thickness in the range from about 0.5 microns to about 50 microns, preferably in the range of in the range from about 10 to about 30 microns, and most preferably about 20 microns to about 25 microns.

The anodizing conditions needed to obtain a useful $Al_2O_3$ film on aluminum depend to some extent on the electrolyte used to oxidize the aluminum. The preferred electrolytes are sulfuric acid, chromic acid, and mixtures of these acids. Sulfuric acid is preferably used in a concentration of about 10 to about 20% by weight, at a temperature of about 15°–25° C., and chromic acid is preferably used in a concentration of 3 to about 10% by weight at a temperature of about 30° to about 50° C. An initial current density of about 10 to about 200 $mA/dm^2$ has been found to be useful. At constant voltage the current density decreases as the anodic film is formed.

The styrene-acrylate resin which is electrophoretically deposited within the pores of the $Al_2O_3$ film has excellent dielectric properties.

Reference herein to the thickness of a resin layer includes the depth of the pores occupied by the resin. For example, a 20 micron layer of resin electrophoretically deposited on a porous layer of $Al_2O_3$ which is 20 microns thick will produce a composite which is 20 microns thick. Similarly, an 18 micron layer of resin on a 20 micron layer of porous $Al_2O_3$ will result in a composite 20 microns thick. A suitable thickness of a styrene-acylate filler for a film of porous $Al_2O_3$ is from about 10% to about 100% of the thickness of the $Al_2O_3$ film, preferably from about 90% to about 100% of the $Al_2O_3$ film thickness, and the optimum thickness is one in which the pores are completely filled and there is substantially no electrophoretically deposited styrene-acrylate resin on surface 13 of the porous $Al_2O_3$, i.e., the styrene-acrylate does not form a continuous layer, but instead is discontinuous.

The preferred resin includes a melamine which functions as a catalytic cross-linking agent. A particularly suitable electrophoretic process is the "Eldep" process developed by the DuPont Corporation, and marketed under this tradename by Whittaker Chemical Company, Decatur, Ala.

Suitable conditions for electrophoretically depositing resin in the micropores of the $Al_2O_3$ coating are a current density of about 0.1 to about 2 $mA/cm^2$. A current density in this range will require from about 0.5 to 5.0 minutes to electrophoretically deposit a layer of resin 25 microns thick in the pores of a porous $Al_2O_3$ film 25 microns thick.

After the resin is electrophoretically deposited, the coating is cured in an oven at a temperature from about 160° C. to 220° C. for a period from about 20 to about 30 minutes. The curing step reduces the thickness of the coating and the reduction varies as a function of temperature. For example, coatings which are cured at 280° C. for 30 minutes are only about 40% as thick as those cured at 160° to 220° C. for about 30 minutes.

Having thus described the present invention, the following example is offered to illustrate it in more detail.

EXAMPLE

Aluminum coupons are anodized in a solution of chromic acid that is prepared by adding 50 grams of reagent grade $CrO_3$ to one liter of deionized water. The resulting electrolyte is maintained at a temperature of 35±1° C. during use. During anodization an aluminum coupon is biased at a cell voltage of 5 volts for 5 minutes. The forming voltage is then increased to 40 volts for 30 minutes to obtain a coating thickness of 25 microns. Approximately 5% of the surface of the resulting $Al_2O_3$ film is represented by pores having a diameter of about 0.1 to 0.5 microns.

Styrene acrylate coatings are deposited on the porous anodized aluminum substrate from an electrolyte prepared by mixing 1 part of "Eldep" resin with 8 parts deionized water. A current density of about 0.5 to 1.5 $mA/cm^2$ is used to deposit a resin coating to a depth of about 25 microns. After electrolysis, the coatings are rinsed in deionized water, air dried, then cured in an oven for 30 minutes at a temperature of about 220° C. After curing the styrene-acrylate copolymer in the pores is about 20–25 microns thick. The resulting composite layer of $Al_2O_3$/styrene-acrylate has an overall thickness of about 25 microns, a dielectric strength of over 5,000 volts and a thermal conductivity of about 0.5 to about 0.8 watts/meter-Kelvin.

The foregoing description is intended to illustrate, not to limit, the present invention. Workers in the art will readily be able to make modifications therein without changing the scope of the invention which should be limited only in accordance with the claims attached hereto.

What is claimed is:

1. A photovoltaic assembly for converting high intensity solar radiation into electrical energy comprising:
   (a) a base comprising a thermally-conductive backing plate and a composite, thermally-conductive dielectric layer integral with a surface of said backing plate, said composite thermally-conductive dielectric layer comprising a thin film of porous $Al_2O_3$ and an electrophoretically-deposited styrene-acrylate resin within the pores of said film of porous $Al_2O_3$; and,
   (b) a plurality of photovoltaic cells in thermal contact with said composite thermally-conductive dielectric layer, whereby heat generated in said photovoltaic cell is transmitted to said backing plate.

2. An assembly according to claim 1 wherein said backing plate comprises a metal selected from aluminum, aluminum alloys, copper, and copper alloys.

3. An assembly according to claim 1 wherein said electrophoretically-deposited resin is a styrene-acrylate copolymer cross-linked with a melamine group.

4. An assembly according to claim 1 wherein the thickness of said thin film of porous $Al_2O_3$ is about 0.5 to about 50 microns.

5. An assembly according to claim 1 wherein the thickness of said thin film of porous $Al_2O_3$ is about 10 to about 30 microns.

6. An assembly according to claim 1 wherein the thickness of said thin film of porous $Al_2O_3$ is about 20 to about 25 microns.

7. An assembly according to claim 1 wherein said electrophoretically-deposited resin within the pores of said film of $Al_2O_3$ has a thickness of about 10 to 100% of the thickness of said film of $Al_2O_3$.

8. An assembly according to claim 1 wherein said electrophoretically-deposited resin within the pores of said film of $Al_2O_3$ has a thickness of about 90 to 100% of the thickness of said film of $Al_2O_3$.

9. An assembly according to claim 1 wherein said composite, thermally-conductive dielectric layer exhibits a breakdown voltage of at least about 2,000 volts and a thermal conductivity of at least about 0.5 watts/meter-°Kelvin.

10. An assembly according to claim 1 wherein said composite, thermally-conductive dielectric layer exhibits a breakdown voltage of at least about 5,000 volts and a thermal conductivity of about 0.5 to about 0.8 watts/meter-°Kelvin.

11. A method of making a photovoltaic assembly for converting high intensity solar radiation into electrical energy comprising:
 (a) forming a thin film of porous $Al_2O_3$ on a surface of a thermally-conductive backing plate;
 (b) contacting the resulting film of $Al_2O_3$ with an electrophoretic bath of a styrene-acrylate resin under conditions which result in the pores of said film being deposited within said resin, thereby forming a composite, thermally-conductive dielectric layer on said backing plate;
 (c) curing the resulting electrophoretically deposited resin; and,
 (d) affixing a plurality of photovoltaic cells to said composite, thermally-conductive dielectric layer.

12. A method according to claim 11 wherein said backing plate comprises an aluminum-containing member, and said thin film of $Al_2O_3$ is formed on said backing plate by electrolytically oxidizing a surface of said aluminum-containing member in an anodizing bath.

13. A method according to claim 12 wherein said anodizing bath is an aqueous solution containing chromic acid.

14. A method according to claim 12, wherein said anodizing bath is an aqueous solution containing sulfuric acid.

15. A method according to claim 11 wherein said styrene-acrylate resin contains a melamine.

16. A method according to claim 11 wherein said styrene-acrylate resin is cured by heating to a temperature of about 160° to about 220° C. for a period of about 20 to about 30 minutes.

* * * * *